US010243554B2

(12) United States Patent
Rachupalli et al.

(10) Patent No.: US 10,243,554 B2
(45) Date of Patent: Mar. 26, 2019

(54) POWER SWITCHING CIRCUIT

(71) Applicant: NXP B.V., Eindhoven (NL)

(72) Inventors: Guru Rachupalli, Bangalore (IN); Venkata Satya Sai Evani, Bangalore (IN); Jaydeep Dalwadi, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/435,244

(22) Filed: Feb. 16, 2017

(65) Prior Publication Data
US 2017/0244405 A1 Aug. 24, 2017

(30) Foreign Application Priority Data

Feb. 16, 2016 (IN) .............................. 201611005879
Apr. 5, 2016 (EP) .................................... 16163854

(51) Int. Cl.
*H03K 17/22* (2006.01)
*G06K 19/07* (2006.01)
*G05F 3/08* (2006.01)

(52) U.S. Cl.
CPC ............ *H03K 17/223* (2013.01); *G05F 3/08* (2013.01); *G06K 19/0701* (2013.01); *G06K 19/0723* (2013.01)

(58) Field of Classification Search
CPC ....................................................... G05F 3/08
See application file for complete search history.

(56) References Cited

U.S. PATENT DOCUMENTS

| 3,502,905 | A | * | 3/1970 | Bicking | G01R 19/0038 327/432 |
| 5,703,415 | A | * | 12/1997 | Tanaka | G11C 5/141 307/66 |
| 6,002,295 | A | * | 12/1999 | Gens | G05F 1/59 327/541 |
| 6,285,091 | B1 | * | 9/2001 | Chan | H02J 9/061 307/64 |
| 7,446,434 | B1 | | 11/2008 | Simmons et al. | |
| 7,808,387 | B1 | | 10/2010 | Kuhn | |
| 2010/0088534 | A1 | | 4/2010 | Watanabe et al. | |

FOREIGN PATENT DOCUMENTS

WO     2008/028132 A2     3/2008

OTHER PUBLICATIONS

Extended European Search Report for Patent Appln. No. 16163854.9 (dated Aug. 2, 2017).
"M24LR04E-R—Dynamic NFC/RFID tag IC with 4-Kbit EEPROM, energy harvesting, I²C bus and ISO 15693 RF interface", ST, 145 pgs, retrieved from the internet at: www.st.com/resource/en/datasheet/m24lr04e-r.pdf (Nov. 2015).

* cited by examiner

*Primary Examiner* — Jeffrey S Zweizig

(57) ABSTRACT

According to a first aspect of the present disclosure, a power switching circuit is provided, comprising: a bandgap reference circuit configured to receive an input voltage and to generate a reference voltage in response to receiving said input voltage; a supply selection circuit configured to receive at least two supply voltages, to select the highest voltage of said supply voltages and to provide said highest voltage to the bandgap reference circuit. According to a second aspect of the present disclosure, a corresponding method of operating a power switching circuit is conceived.

6 Claims, 6 Drawing Sheets

POWER SWITCHING CIRCUIT

CROSS-REFERENCE TO RELATED APPLICATIONS

This application claims the priority under 35 U.S.C. § 119 of Indian patent application no. 201611005879, filed on Feb. 19, 2016, and European patent application no. 16163854.9, filed on Apr. 5, 2016, the contents of which are incorporated by reference herein.

FIELD

The present disclosure relates to a power switching circuit. Furthermore, the present disclosure relates to a corresponding method of operating a power switching circuit.

BACKGROUND

Certain devices, such as NEC or RFID tags, may have two or more interfaces. In particular, in addition to an NFC of RFID interface (i.e., a contactless interface) these devices may have a contact interface. An example of such a device is a dual-interface NFC tag compliant with the NFC Forum standards.

SUMMARY

According to a first aspect of the present disclosure, a power switching circuit is provided, comprising: a bandgap reference circuit (BGR) configured to receive an input voltage and to generate a reference voltage in response to receiving said input voltage; a supply selection circuit configured to receive at least two supply voltages, to select the highest voltage of said supply voltages and to provide said highest voltage to the bandgap reference circuit.

In one or more embodiments, a first supply voltage is derived from an RF input of said power switching circuit.

In one or more embodiments, a second supply voltage is derived from a contact-interface input of said power switching circuit.

In one or more embodiments, the power switching circuit further comprises a voltage blocking circuit configured to block the second supply voltage if said second supply voltage is below a threshold.

In one or more embodiments, the power switching circuit further comprises a plurality of power switches for facilitating switching between the supply voltages, and the voltage blocking circuit is configured to prevent said power switches from receiving the second supply voltage if said second supply voltage is below the threshold.

In one or more embodiments, the voltage blocking circuit is a power-on reset circuit (POR).

In one or more embodiments, the supply selection circuit comprises a first stage and a second stage, the first stage is configured to create a differential voltage from input currents induced by the supply voltages, and the second stage is configured to amplify said differential voltage and to switch the maximum of the supply voltages to an output voltage.

In one or more embodiments, a NFC/RFID tag circuit comprises the power switching circuit of the kind set forth, a contactless interface and a contact interface, and the contactless interface and the contact interface are configured to provide the supply voltages to the power switching circuit.

In one or more embodiments, the NFC/RFID tag circuit further comprises an output interface, and the power switching circuit is configured to provide an output voltage to an external device through said output interface.

In one or more embodiments, the output interface is an $I^2C$ interface.

According to a second aspect of the present disclosure, a method of operating a power switching circuit is conceived, comprising: a bandgap reference circuit of said power switching circuit receives an input voltage and generates a reference voltage in response to receiving said input voltage; a supply selection circuit of said power switching circuit receives at least two supply voltages, selects the highest voltage of said supply voltages and provides said highest voltage to the bandgap reference circuit.

In one or more embodiments, a first supply voltage is derived from an RF input of said power switching circuit.

In one or more embodiments, a second supply voltage is derived from a contact-interface input of said power switching circuit.

In one or more embodiments, a voltage blocking circuit of said power switching circuit blocks the second supply voltage if said second supply voltage is below a threshold.

In one or more embodiments, the voltage blocking circuit prevents power switches of said power switching circuit from receiving the second supply voltage if said second supply voltage is below the threshold.

DESCRIPTION OF DRAWINGS

Embodiments will be described in more detail with reference to the appended drawings, in which.

DESCRIPTION OF EMBODIMENTS

Figure 1:
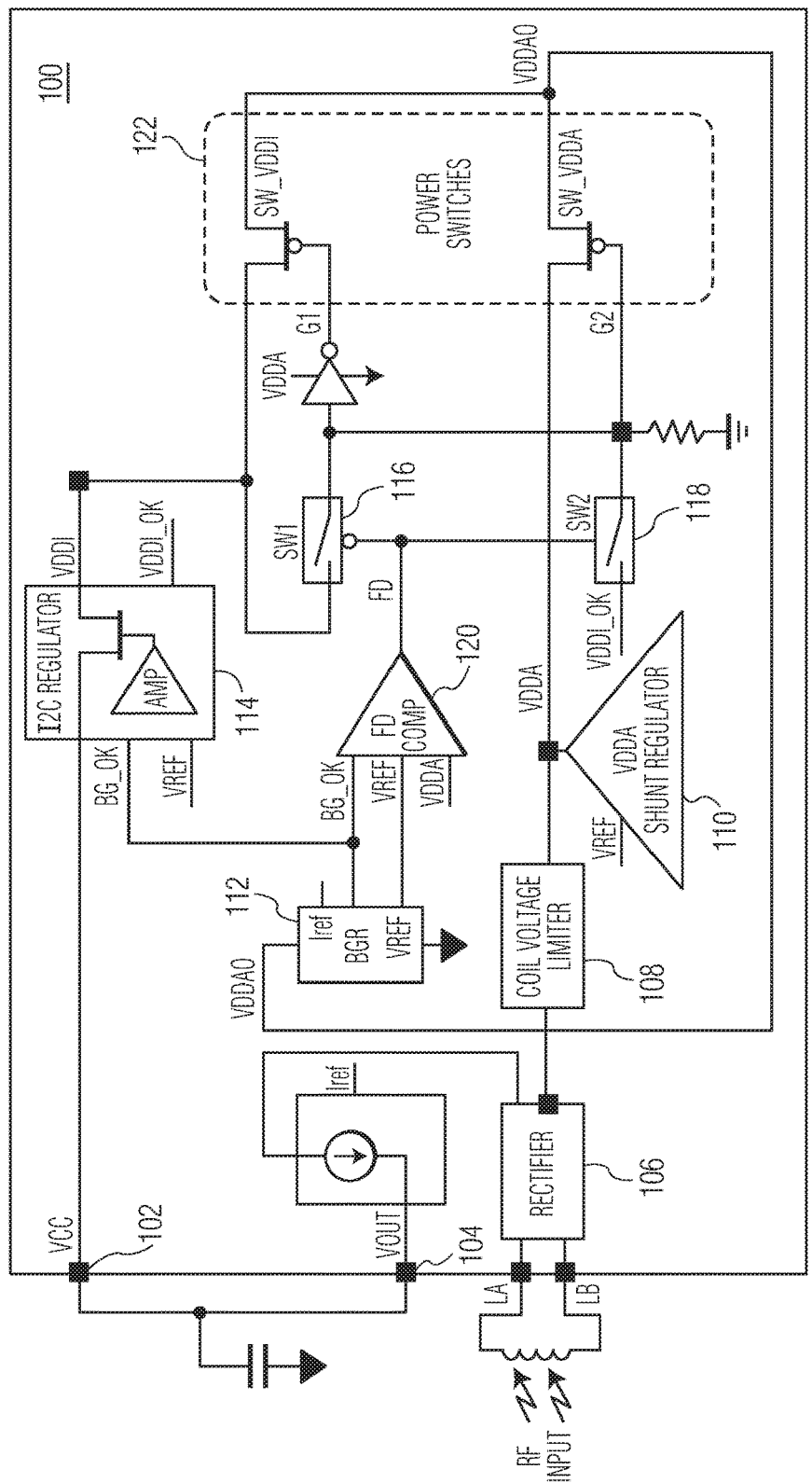
FIG. 1 shows an example of a power switching circuit.

FIG. 1 shows an example of a power switching circuit 100. The power switching circuit 100 comprises a power switching circuit 100, a VCC pin 102, a VOUT pin 104, a rectifier 106, a coil voltage limiter 108, a VDDA shunt regulator 110, a bandgap reference circuit 112, an $I^2C$ regulator 114, an FD comparator 120, power switches 122, and control gates 116, 118 of the power switches 122. A power switching circuit 100 of this kind is often used in dual-interface NFC or RFID tag circuit. In particular, dual-interface NFC or RFID tags may be supplied with power through both interfaces, and a power switching circuit may be configured to switch between the different power sources.

Tag circuits with a dual power supply, i.e. a contactless (RF) power supply and contact-based power supply (VCC) may contain a complex power switching mechanism for choosing one of these supplies for the system. Tag circuits of this kind may provide the energy received from the contactless or contact-based power supply to an external device (e.g., a microcontroller) through an output interface (e.g., an $I^2C$ interface). Examples of such tag circuits are the "NTAG $I^2C$" and "NTAG $I^2C$ Plus" devices manufactured by NXP Semiconductors. NTAG devices may operate in a so-called energy-harvesting mode in which the VCC pin can be powered from the RF field, as shown in FIG. 1.

In operation, the VOUT pin 104 sources constant current from a regulated supply voltage derived from the RF input. In the energy-harvesting mode, the VCC pin 102 is shorted to the VOUT pin 104. Both the I²C regulator 114 and the VDDA shunt regulator 110 have threshold-voltage (VTH) based, crude pre-regulators which can bring their output voltages to a value where the bandgap reference circuit 112 can be operational, once the respective input supply is turned ON. Once reference voltage builds up, the main loop in the regulators brings the output voltage (VDDAO) of the power switching circuit to a final regulated voltage. Note that VDDA is the regulated supply voltage derived from the RF input and VDDI is the regulated supply voltage derived from the contact-based power supply.

Furthermore, the signal FD (field detect) will be high if BG_OK is high and VDDA rises above a certain threshold voltage level. FD high indicates that the RF field is ON and that VDDA is ready to supply the load. Signal VDDI_OK will be high if BG_OK is high and VDDI rises above a certain threshold voltage level. VDDI_OK high indicates that VCC is ON and that VDDI is ready to supply the load. If FD is low (i.e., in the absence of an RF field), the gate SW1 116 will be turned ON and the gate SW2 118 will be turned OFF. VDDI passes through gate SW1 116 pulling net G1 to low. As a result, switch SW_VDDI will be turned ON making VDDAO=VDDI. If FD is high gate SW1 116 will be turned OFF and gate SW2 118 will be turned ON. As a result, VDDI_OK passes to net G2. Depending on the state of VDDI_OK, the signal VDDAO is now defined as follows: if VDDI_OK is high, net G1 will be low making VDDAO=VDDI, otherwise if VDDI_OK is low, net G2 will be low making VDDAO=VDDA.

During short RF resets, VCC (VOUT) can discharge to any value depending on the RF reset duration and the current flowing through VCC. The circuit condition when there is no RF input and at lower VCC voltage may be as follows:

VDDA~0V
FD~0V
VDDI~VCC
G1~0V
G2~VDDI
VDDAO~VDDI

At above VDDAO voltage, the bandgap reference circuit 112 might not work properly and the BG_OK signal might be low. When the system is in the above condition and RF turns ON, VDDA rises partially as defined by a pre-regulator. The voltage VDDA is blocked by VDDI (net G2) so as to not pass to VDDAO. A further increase in the voltage VDDA needs a reference voltage to come up, which indeed needs the voltage VDDAO to come up. Ultimately, the system may remain in this state indefinitely.

Figure 2:
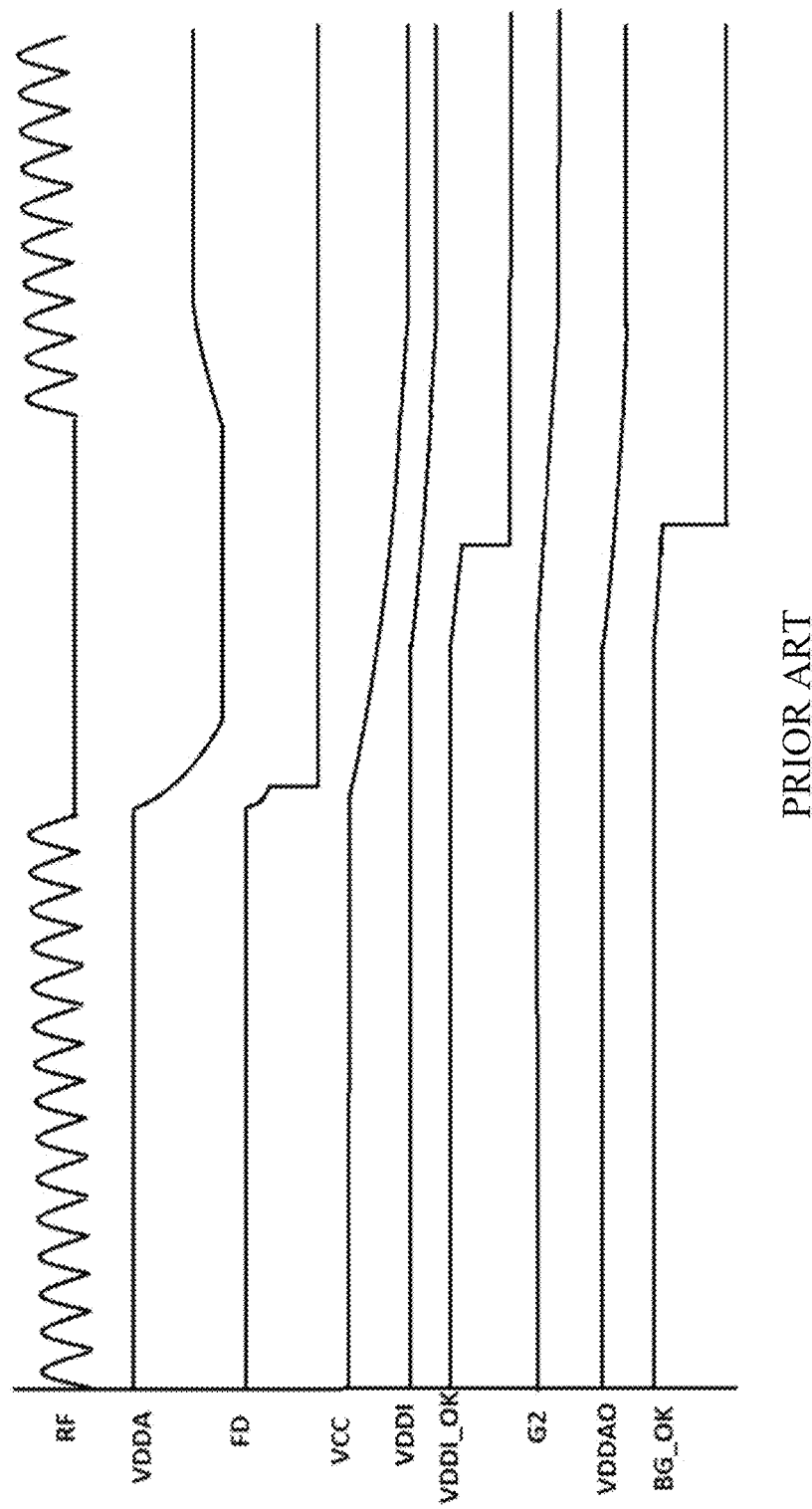
FIG. 2 shows example waveforms for the power switching circuit of FIG. 1.

FIG. 2 shows example waveforms for the power switching circuit of FIG. 1. In particular, it shows that after a short RF reset VDDAO doesn't rise and follows VDDI. Furthermore, FD and BG_OK remain in a logic low state. Furthermore, VDDA rises partially and remains there. Thus, as mentioned above, the system may remain indefinitely in a certain state.

Therefore, according to a first aspect of the present disclosure, a power switching circuit is provided, comprising: a bandgap reference circuit configured to receive an input voltage and to generate a reference voltage in response to receiving said input voltage, and a supply selection circuit configured to receive at least two supply voltages, to select the highest voltage of said supply voltages and to provide said highest voltage to the bandgap reference circuit. In this way, it may be prevented that the system is trapped in a certain state. In particular, it allows the bandgap reference circuit to start up immediately in the sense that any of the supply voltages is promptly available to it. In particular, a first supply voltage may be derived from an RF input of said power switching circuit. Furthermore, a second supply voltage may be derived from a contact-interface input of said power switching circuit. Thus, a practical and efficient implementation of a power switching circuit for use in a dual-interface tag may be realized, while avoiding that the power switching circuit is trapped in a certain state. Furthermore, in one or more embodiments, the power switching circuit includes a voltage blocking circuit configured to block the second supply voltage if said second supply voltage is below a threshold. This may also contribute to preventing that the power switching circuit is trapped in a certain state. In a practical and efficient implementation, the voltage blocking circuit is a power-on reset (POR) circuit.

Figure 3:
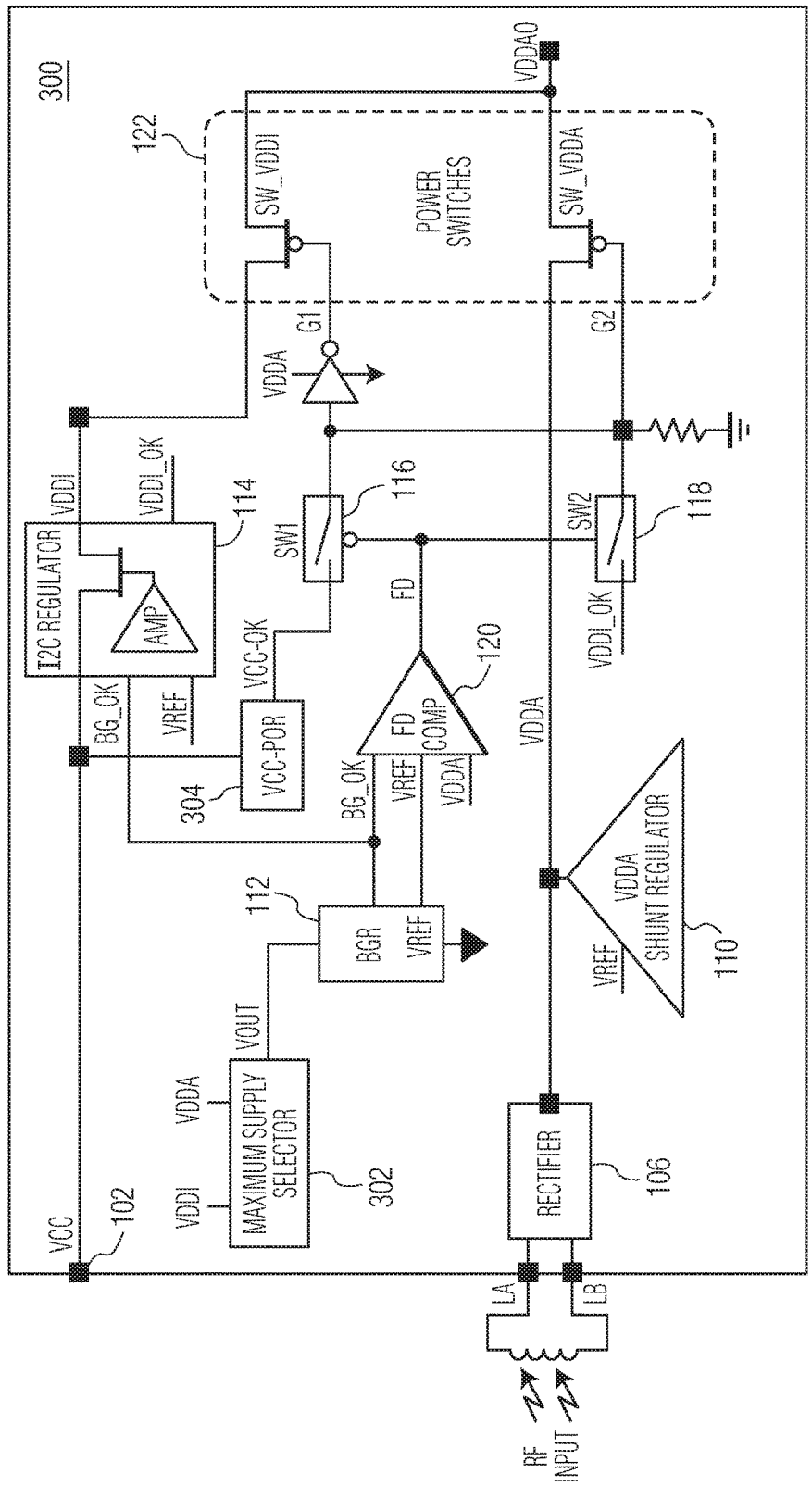
FIG. 3 shows an illustrative embodiment of a power switching circuit.
Figure 4:
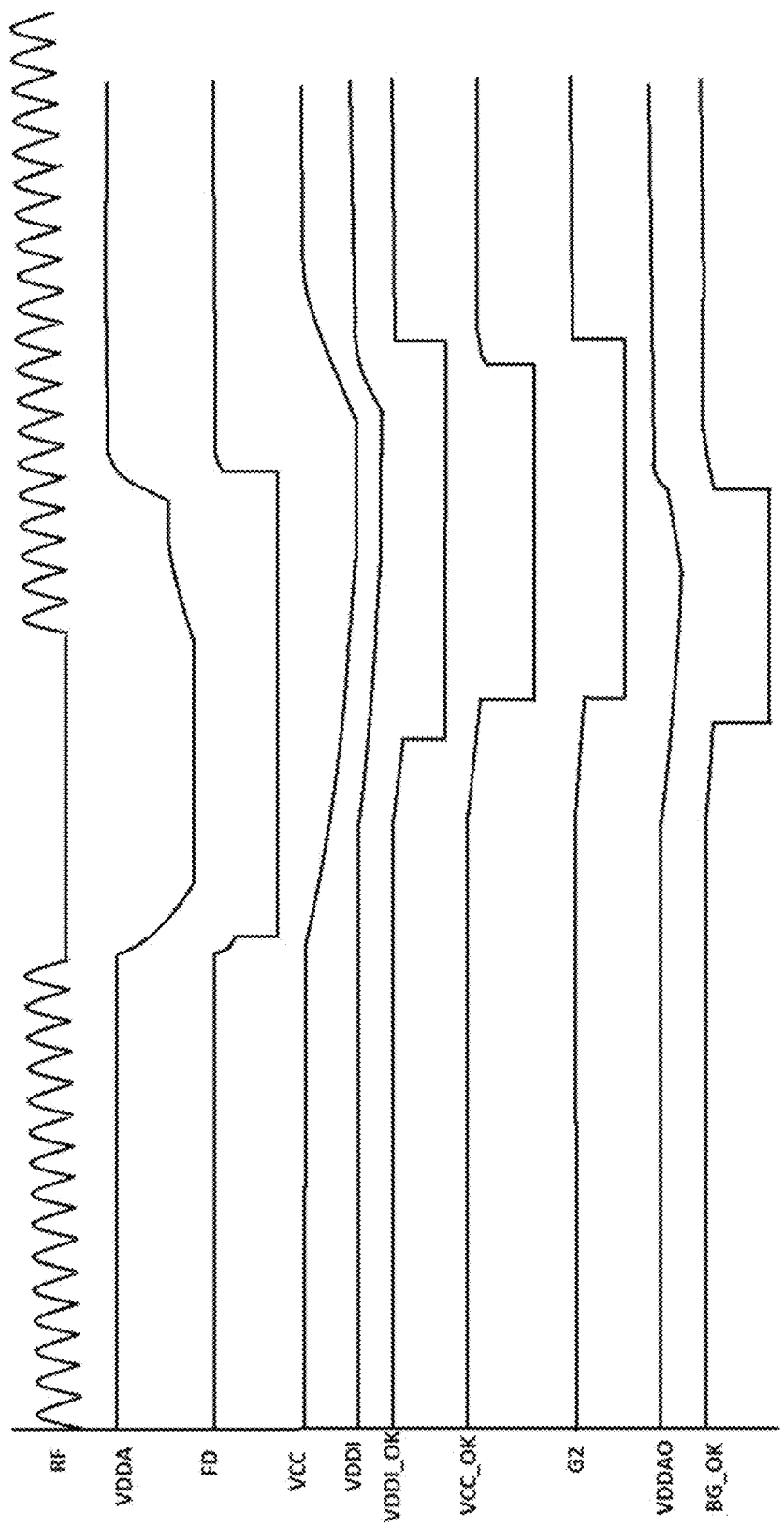
FIG. 4 shows example waveforms for the power switching circuit of FIG. 3.

FIG. 3 shows an illustrative embodiment of a power switching circuit 300. The power switching circuit 300 comprises, in addition to components shown in FIG. 1, a maximum supply selector 302 (i.e., a supply selection circuit) and a VCC-POR circuit 304 (i.e., a voltage blocking circuit implemented as a power-on reset circuit). The maximum supply selector 302 is operatively coupled to the bandgap reference circuit 112. In operation, the maximum supply selector 302 receives VDDI and VDDA, selects the maximum of VDDI and VDDA, and provides said maximum to the bandgap reference circuit 112. Thus, the bandgap reference circuit 112 is effectively powered by the maximum of the supply voltages VDDI and VDDA, thus allowing the bandgap reference circuit 112 to start up immediately in the sense that any of the supply voltages VDDI and VDDA is promptly available to it. Furthermore, the VCC-POR circuit 304 blocks the voltage VCC if VCC is below a predefined threshold. For example, 1.2V is a suitable threshold. In a practical and efficient implementation, the VCC-POR circuit 304 prevents the power switches 122 from receiving VCC if VCC is below said threshold. Thus, the VCC-POR circuit 304 effectively blocks lower VCC voltages so that they do not enter into the power switches 122, thus making net G2 low at lower VCC voltages. This allows VDDA to pass to VDDAO upon card entering into RF field. FIG. 4 shows example waveforms for the power switching circuit of FIG. 3. As shown, once RF turns ON after a reset VDDA starts rising by pre-regulator. The maximum supply selector switches to VDDA from VDDI once VDDA rises above the VDDI voltage. As the supply to the bandgap reference circuit rises, BG_OK is asserted HIGH (meaning that the bandgap reference circuit has started up and that the reference voltages generated by it are stable) causing VDDA to reach the state of a final regulated voltage. It is also shown that if VCC voltage is low VCC_OK will be low, causing voltage at net G2 to be low. This allows VDDA to pass to VDDAO.

Figure 5:
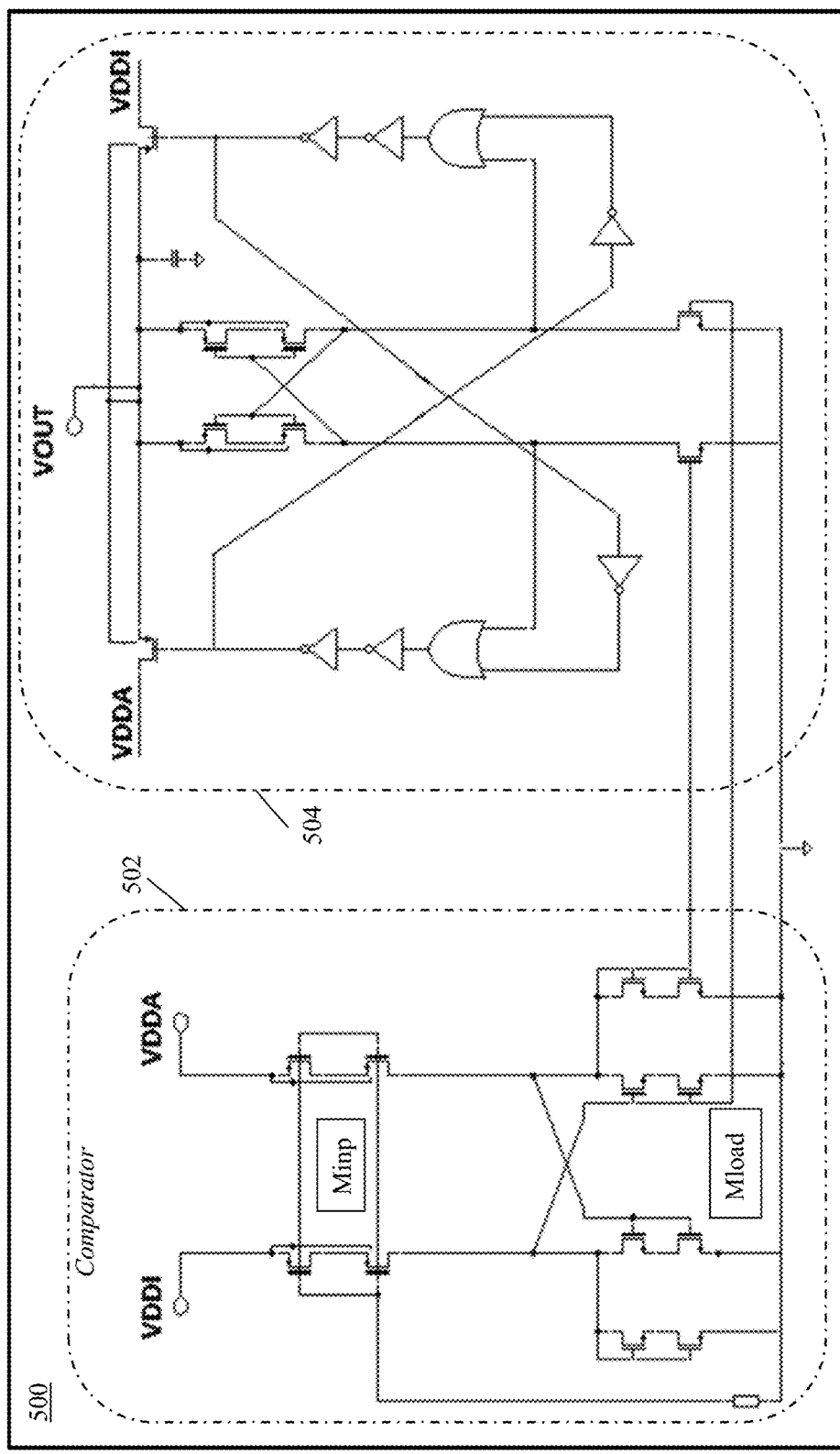
FIG. 5 shows an illustrative embodiment of a supply selection circuit.

FIG. 5 shows an illustrative embodiment of a supply selection circuit 500. The supply selection circuit 500 includes a first stage 502 (i.e., an input stage or comparator) and a second stage 504. The size of the input transistors of the comparator 502 may be properly chosen, so as to limit the current induced by the voltage VDDA. Also, in order to ensure proper operation, the minimum voltage required for the comparator 502 to operate with sufficient gain may be Vov [Overdrive voltage of Input Transistors, Minp] ÷VTH

[Threshold of Load Transistors, Mload] ~0.8 V. The input stage 502 is a common-gate stage which senses voltages VDDI and VDDA and converts them to a proportional current. The first stage load is a hysteresis-generating cross-coupled architecture which creates a differential voltage from input currents. This differential voltage is proportional to the voltage difference between the power supplies. The second stage 504 amplifies this differential voltage and switches the maximum of two input voltage to VOUT. A break-before-make configuration may be implemented in the second stage 504 so as to avoid a shoot-through current while switching.

Figure 6:
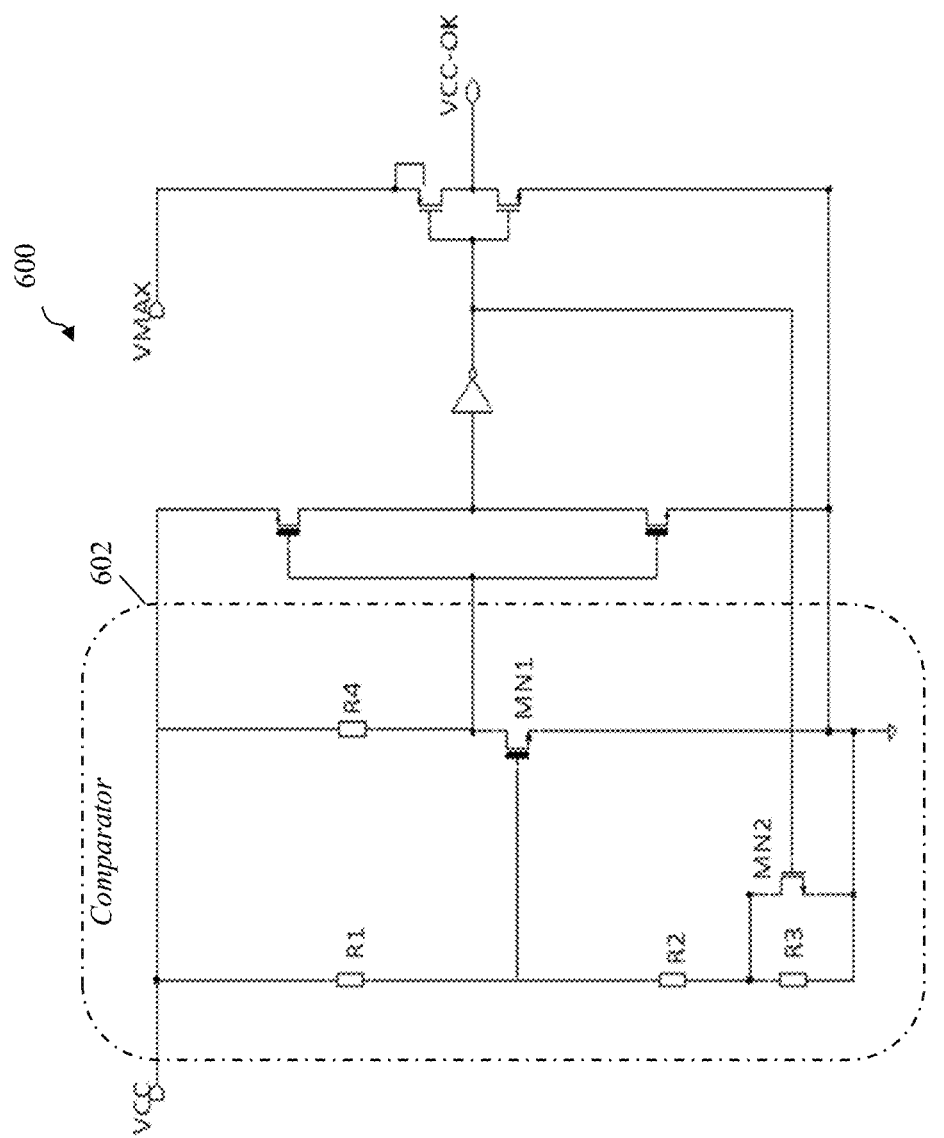
FIG. 6 shows an illustrative embodiment of a voltage blocking circuit.

FIG. 6 shows an illustrative embodiment of a voltage blocking circuit 600. The voltage blocking circuit 600 comprises a comparator 602. Resistors R1 and R2 define the trip voltage of the voltage blocking circuit 600 for a given size of transistor MN1 and resistor R4. The type of resistor R4 may be chosen carefully to counter VT variation of transistor MN1 with temperature. Transistor MN2 and resistor R3 introduce hysteresis. In order to increase the reliability of the circuit, the output may be level shifted to VMAX.

The presently disclosed power switching circuit may be used to advantage in NFC or RFID tag circuits, in particular in dual-interface NFC or RFID tag circuits. In that case, the first supply voltage may be provided by a so-called contactless interface, for example as defined in the standard ISO/IEC 14443, and the second supply voltage may be provided by a so-called contact interface, for example as defined in the standard ISO/IEC 7816. Furthermore, the tag circuit may include an output interface, for example an I²C interface for coupling the tag circuit to an external device (e.g., a microcontroller). In that case, the presently disclosed power switching circuit may be configured to provide an output voltage to this external device through said output interface.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 power switching circuit
102 VCC pin
104 VOUT pin
106 rectifier
108 coil voltage limiter
110 VDDA shunt regulator
112 bandgap reference circuit
114 I²C regulator
116 control gate
118 control gate
120 FD comparator
122 power switches
300 power switching circuit
302 maximum supply selector
304 VCC-POR circuit
500 maximum supply selector
502 first stage (comparator)
504 second stage
600 VCC-POR circuit
602 comparator

The invention claimed is:

1. A power switching circuit, comprising:
a bandgap reference circuit configured to receive an input voltage and to generate a reference voltage in response to receiving said input voltage;
a supply selection circuit configured to receive at least two supply voltages, to select the highest voltage of said supply voltages and to provide said highest voltage to the bandgap reference circuit,
wherein a first supply voltage of the at least two supply voltages is derived from an RF input of said power switching circuit;
wherein a second supply voltage of the at least two supply voltages is derived from a contact-interface input of said power switching circuit; and
a voltage blocking circuit configured to block the second supply voltage if said second supply voltage is below a threshold, wherein the voltage blocking circuit is a power-on reset circuit.

2. The power switching circuit of claim 1, wherein the supply selection circuit comprises a first stage and a second stage, wherein the first stage is configured to create a differential voltage from input currents induced by the supply voltages, and wherein the second stage is configured to amplify said differential voltage and to switch the maximum of the supply voltages to an output voltage.

3. An NFC/RFID tag circuit comprising the power switching circuit of claim 1, a contactless interface and a contact interface, wherein the contactless interface and the contact interface are configured to provide the supply voltages to the power switching circuit.

4. The NFC/RFID tag circuit of claim 3, further comprising an output interface, wherein the power switching circuit is configured to provide an output voltage to an external device through said output interface.

5. The NFC/RFID tag circuit of claim 4, wherein the output interface is an I²C interface.

6. A method of operating a power switching circuit, comprising:
   a bandgap reference circuit of said power switching circuit receives an input voltage and generates a reference voltage in response to receiving said input voltage;
   a supply selection circuit of said power switching circuit receives at least two supply voltages, selects the highest voltage of said supply voltages and provides said highest voltage to the bandgap reference circuit,
   wherein a first supply voltage of the at least two supply voltages is derived from an RF input of said power switching circuit;
   wherein a second supply voltage of the at least two supply voltages is derived from a contact-interface input of said power switching circuit; and
   a voltage blocking circuit of said power switching circuit blocks the second supply voltage if said second supply voltage is below a threshold, wherein the voltage blocking circuit is a power-on reset circuit.

* * * * *